United States Patent [19]
Kuroda et al.

[11] 3,987,377
[45] Oct. 19, 1976

[54] ELASTIC SURFACE WAVE PROPAGATION DEVICE
[75] Inventors: Kenichi Kuroda; Fujio Ishihara, both of Tokyo, Japan
[73] Assignee: Nippon Telegraph and Telephone Public Corporation, Tokyo, Japan
[22] Filed: Feb. 5, 1975
[21] Appl. No.: 547,210

[30] Foreign Application Priority Data
Feb. 12, 1974   Japan............................... 49-16957

[52] U.S. Cl. ............................... 333/30 R; 310/9.5; 310/9.8; 333/72
[51] Int. Cl.² ...................... H03H 9/26; H03H 9/30; H03H 9/32; H01L 41/18
[58] Field of Search................. 333/30 R, 72; 310/8, 310/8.1, 8.2, 9.5, 9.7, 9.8

[56]  References Cited
UNITED STATES PATENTS
3,818,382   6/1974   Holland et al. ............... 333/30 R X
3,873,946   3/1975   Weglein ............................ 333/30 R OTHER PUBLICATIONS
Hartmann et al., "Impulse Model Design of Acoustic Surface Wave Filters" in IEEE Trans on Microwave Theory and Techniques, vol. MTT-21 No. 4, Apr. 1973; pp. 162 and 171.
Schulz et al., "Surface Acoustic Wave Delay Lines With Small Temperature Coefficient" in Proceedings IEEE (USA) vol. 58 No. 9, Sept. 1970; pp. 1361-1362.

Primary Examiner—Alfred E. Smith
Assistant Examiner—Marvin Nussbaum
Attorney, Agent, or Firm—Marshall & Yeasting

[57]  ABSTRACT

An elastic surface wave propagation device is disclosed which is composed of a substrate for elastic surface wave propagation and at least one transducer disposed on the major surface of the substrate for converting an electric signal into an elastic surface wave or vice versa. The substrate is formed of quartz crystal and the major surface of the substrate is 43° rotated Y cut plane of the quartz crystal. The angle between the direction of propagation of the elastic surface wave and the X-axis direction of the quartz crystal is selected to be in the range of 8° to 12° so that spurious components are sufficiently suppressed or negligible.

4 Claims, 7 Drawing Figures

ELASTIC SURFACE WAVE PROPAGATION DEVICE

BACKGROUND OF THE INVENTION

1. Field of the Invention

This invention relates to an elastic surface wave propagation device which can be employed as a delay line or a band-pass or band-rejection filter, and more particularly to an elastic surface wave propagation device which comprises a substrate for the propagation of elastic surface wave and at least one transducer disposed on the major surface of the substrate for converting an electric signal into an elastic surface wave or vice versa and in which the elastic surface wave derived from the transducer is propagated on the major surface of the substrate or an elastic surface wave is propagated towards the transducer.

2. Description of the Prior Art

There has heretofore been proposed an elastic surface wave propagation device of this kind which employs, as a substrate for the propagation of the elastic surface wave, a quartz crystal substrate whose major surface is a 42.75° rotated Y cut plane, that is, the ST cut plane. The quartz crystal is mechanically hard. Further, in the case where a pair of electrodes are disposed side by side on the major surface of the quartz crystal substrate whose main surface is such an 42.75° rotated Y cut plane, the quartz crystal substrate presents a piezoelectric effect between the pair of electrodes, and its electro-mechanical coupling coefficient is relatively large. Accordingly, only by disposing electrodes directly on the major surface of the quartz crystal substrate, a transducer of relatively high conversion efficiency can be constructed. Moreover, even if the quartz crystal substrate having its major surface formed in the ST cut plane is affected by temperature change, it does not cause any substantial change in the propagation velocity of the elastic surface wave, particularly, a Rayleigh wave which is most typical of it. Accordingly, the elastic surface wave can be effectively propagated on the major surface of the quartz crystal substrate with practically no temperature dependency.

In such a conventional elastic surface wave propagation device, the angle θ between the direction of propagation of the elastic surface wave on the major surface of the quartz crystal substrate and the X-axis direction of the quartz crystal is usually selected to be zero. As a result of this, the conventional device is defective in that spurious components of such magnitude as not to be negligible appear in a frequency range which is 1.7 to 1.8 times higher than the center frequency of an elastic surface wave based on a desired electric signal propagating in the quartz crystal substrate.

Thus, the conventional elastic surface wave propagation device has such advantages that it can be constructed mechanically rigid as a whole, that a transducer can be easily formed on the quartz crystal substrate and that an elastic surface wave can be propagated on the major surface of the quartz crystal without temperature dependency. However, the conventional device is defective in that spurious components of such magnitude as not to be negligible get mixed in the elastic surface wave converted from a desired electric signal.

SUMMARY OF THE INVENTION

Accordingly, this invention is to provide a novel elastic surface wave propagation device which has the abovesaid advantages of the prior art device but is free from the aforesaid defects encountered in the past.

In accordance with one aspect of this invention, the substrate for the propagation of an elastic surface wave is a quartz crystal substrate whose major surface is a 43° rotated Y cut plane. As a result of this, the elastic surface propagation device of this invention has such advantages that it can be constructed mechanically rigid as a whole, that a transducer can easily be formed on the quartz crystal substrate and that the elastic surface wave can be propagated on the major surface of the quartz crystal substrate without temperature dependency.

Further, in accordance with another aspect of this invention, the angle θ between the direction of propagation of the elastic surface wave in the aforesaid quartz crystal substrate and the X-axis direction of the quartz crystal is selected in the range of 8° to 12°. Consequently, according to this invention, spurious responses are sufficiently suppressed or negligible.

Other objects, features and advantages of this invention will become apparent from the following description taken in conjunction with the accompanying drawings.

DESCRIPTION OF THE PREFERRED EMBODIMENTS

Figure 1:
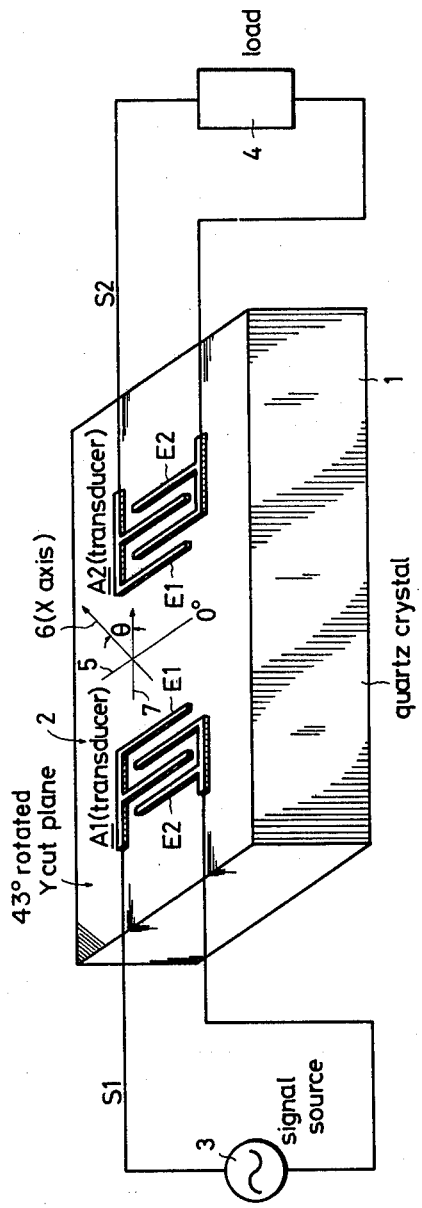
FIG. 1 is a schematic perspective view illustrating one example of the elastic surface wave propagation device produced according to this invention.

In FIG. 1, there is depicted one example of the elastic surface wave propagation device produced according to this invention, which comprises a substrate 1 for the propagation of an elastic surface wave and transmitting and receiving transducers A1 and A2 disposed on the flat major surface 2 of the substrate 1 in a predetermined spaced relation to each other. The substrate 1 is a piezoelectric quartz crystal substrate whose major surface is a 43° rotated Y plane. The transducer A1 is composed of a pair of electrodes E1 and E2 disposed in the ST cut plane of the quartz crystal substrate 1. These electrodes E1 and E2 each have an interdigital conductor structure and their fingers are formed to extend in a direction perpendicular to the direction indicated by a line 7 joining the transducers A1 and A2. The distance between the centers of adjacent ones of the fingers is selected to be substantially equal to the half wavelength of an elastic surface wave based on an electric signal which is desired to obtain on the major surface of the quartz crystal substrate 1. The transducer A2 is also composed of a pair of electrodes E1 and E2 of the interdigital conductor structure disposed on the major surface 2 of the quartz crystal substrate 1, as is the case with the transducer A1.

Between the pair of electrodes E1 and E2 of the transducer A1 is supplied an electric signal S1 from an electric signal source 3 and the electric signal S1 is converted into an elastic surface wave. The elastic surface wave thus obtained is propagated towards the transducer A2 on the major surface 2 of the quartz crystal substrate 1. Since the electrodes E1 and E2 of the transducer A1 each have the interdigital conductor structure and since their fingers extend in the direction perpendicular to the direction indicated by the line 7 joining the transducers A1 and A2, the elastic surface wave on the major surface 2 of the quartz crystal substrate 1 propagates in the direction of extension of the line 7 while forming an equiphase line perpendicular thereto. In FIG. 1, reference numeral 5 indicates the equiphase line of such an elastic surface wave.

The elastic surface wave propagating on the major surface 2 of the quartz crystal substrate 1 is received by the receiving transducer A2 and converted thereby into an electric signal S2, thereafter being supplied to a load 4 connected between the electrodes E1 and E2.

The X-axis 6 of the quartz crystal forming the substrate 1 is parallel with the major surface 2 of the substrate 1, that is, the ST cut plane, but the angle formed between the direction of extension of the X-axis 6 and the direction of propagation of the elastic surface wave, that is, the direction indicated by the line 7 or the direction perpendicular to the line 5, is selected to be in the range of 8° to 12°, preferably 10°. The selection of the value of the angle $\theta$ in the range of 8° to 12° is based on the finding of the fact that when the angle $\theta$ is in the above range, only those spurious components of response which are sufficiently suppressed or negligible get mixed in the elastic surface wave converted from the desired electric signal S1.

FIGS. 2A to 2C, 3A, 3B and 4 show experimental data indicating that the preferred value of the angle $\theta$ is in the range of 8° to 12°.

Figure 2A:
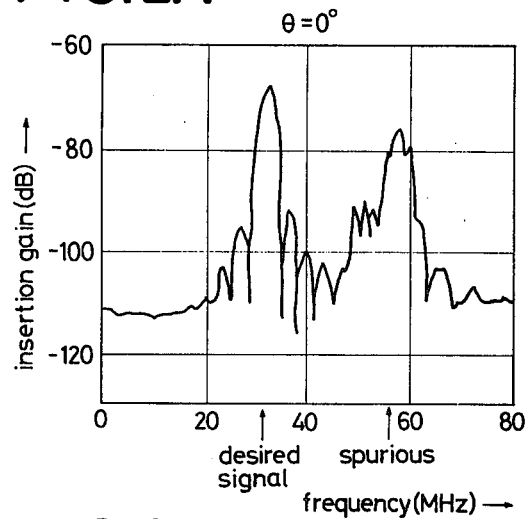
FIGS. 2A to 2C, inclusive, are graphs showing the relationships of insertion gain to frequency.
Figure 2B:
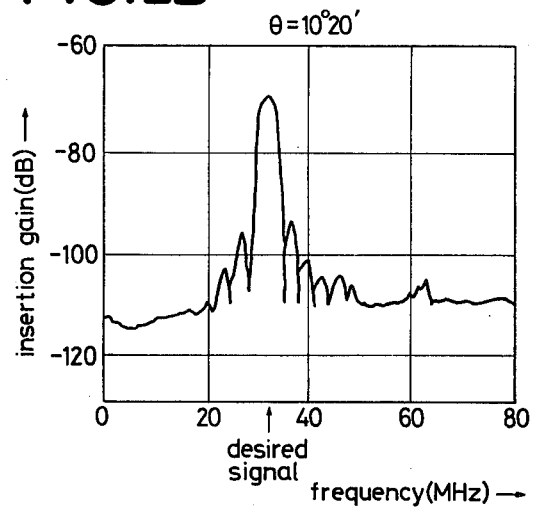
Figure 2C:
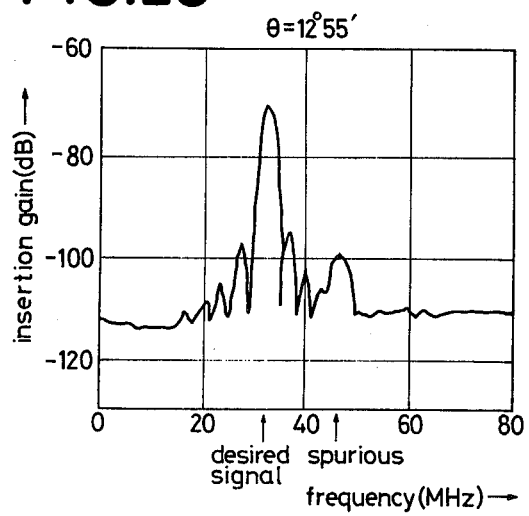

FIGS. 2A to 2C are graphs respectively showing the relationships of insertion gain to frequency in the cases of $\theta = 0°$, $\theta = 10°12'$ and $\theta = 12°55'$ when the distance between the centers of adjacent ones of the fingers of the interdigital conductor structure forming the electrodes E1 and E2 of the transducers A1 and A2 is selected so that a narrow-band filter characteristic having a center frequency of 32 MHz may be obtained between the electrodes E1 and E2 of each of the transducers A1 and A2. In the figures, the abscissa represents frequency (in MHz) and the ordinate the relative insertion gain (in dB). As is seen from FIGS. 2A to 2C, in the case of $\theta = 0°$, spurious components are produced in the vicinity of 55 MHz which is substantially 1.7 to 1.8 times higher than the center frequency 32 MHz of the desired electric signal and the insertion gain (maximum response) of the spurious components is close to that (maximum response) of the desired electric signal; in the case of $\theta = 10°20'$, the maximum response of spurious components is negligible with respect to the maximum response of the desired electric signal; and, in the case of $\theta = 12°55'$, the maximum response of spurious components is not negligible with respect to the desired electric signal. Accordingly, it is apparent that an excellent narrow-band filter characteristic can be obtained in the case of $\theta = 10°20'$.

Figure 4:
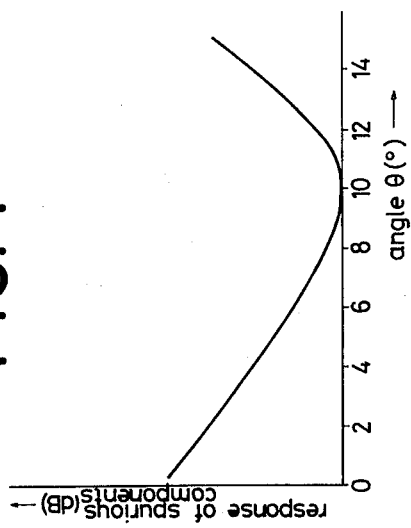
FIG. 4 is a graph showing the relationship of response of spurious components to the angle formed between the direction of propagation of an elastic surface wave and the X-axis direction of quartz crystal.
Figure 3A:
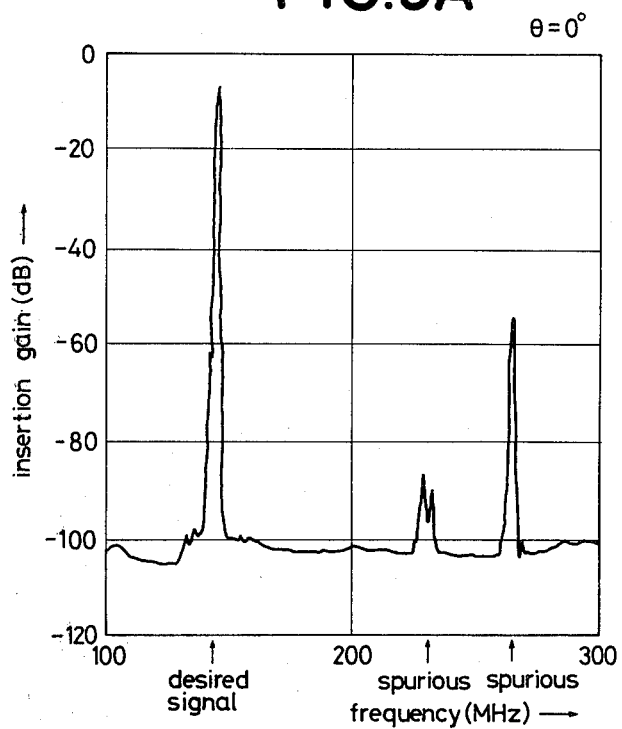
FIGS. 3A and 3B are graphs, similar to FIGS. 2A to 2C, showing the relationships of insertion gain to frequency.
Figure 3B:
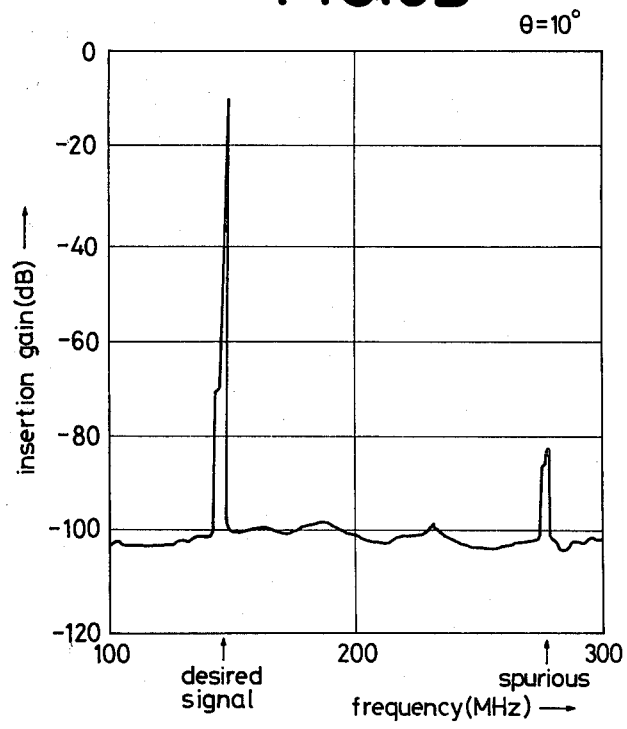

FIGS. 3A and 3B are graphs, similar to FIGS. 2A to 2C, respectively showing the relationships of insertion gain to frequency in the cases of $\theta = 0°$ and $\theta = 10°$ when the distance between the centers of adjacent ones of the fingers of the interdigital conductor structure forming the electrodes E1 and E2 of each of the transducers A1 and A2 is selected such that a narrow-band filter characteristic having a center frequency 145 MHz may be obtained. As is evident from FIGS. 3A and 3B, spurious components of large insertion gain are obtained in the neighborhood of 260 MHz which is about 1.7 to 1.8 times higher than 145 MHz but, in the case of $\theta = 10°$, the insertion gain of the spurious component is suppressed more than 20 dB as compared with the case of $\theta = 0°$. Accordingly, it is seen that an excellent narrow-band filter characteristic can be obtained in the case of $\theta = 10°$. Further, FIG. 4 shows the relationship of the maximum response of the spurious component to the angle $\theta$ in the case of adopting such a construction as to obtain the narrow-band filter characteristic, as described above with regard to FIGS. 2 and 3, the abscissa representing the value of the angle $\theta$ and the ordinate the maximum response (in dB) of the spurious component. With $\theta = 10°$, the maximum response of the spurious component is minimum and, as the angle $\theta$ becomes smaller than 10°, the value of the maximum response increases. Especially, with the angle $\theta$ being less than about 8°, the value of the maximum response becomes remarkedly larger and, with the angle $\theta$ being larger than 10°, the value of the maximum response increases and, especially when the angle $\theta$ becomes larger than 12°, the maximum response remarkedly increases.

Although this invention has been described above as being applied to the elastic surface wave propagation device which has two transducers disposed on a 43° rotated Y cut plane of a quartz crystal substrate and can be employed as a delay line or a narrow-band pass or band-rejection filter, the invention is also applicable to an elastic surface wave propagation device which has one transducer and a reflector disposed opposite thereto on the 43° rotated Y cut plane of the quartz crystal substrate and can be used, for example, as a delay line.

Further, this invention is also applicable to an elastic surface wave propagation device of such a construction that a plurality of pairs of transmitting and receiving transducers are disposed on the quartz crystal substrate, and an elastic surface wave propagation device of such a construction that one transmitting transducer and a plurality of receiving transducers are disposed opposite to each other on the quartz crystal.

It will be apparent that many modifications and variations may be effected without departing from the scope of the novel concepts of this invention.

We claim as our invention:

1. An elastic surface wave propagation device comprising a substrate for elastic surface wave propagation, and at least one transducer disposed on the flat major surface of said substrate for converting an electric signal into an elastic surface wave or vice versa, in which the substrate is formed of quartz crystal; the major surface of the substrate is a 43° rotated Y cut plane of said quartz crystal; and the angle between the direction of propagation of the elastic surface wave and the X-axis of the quartz crystal is in the range of 8° to 12°.

2. An elastic surface wave propagation device according to claim 1 wherein the transducer is composed of electrodes of interdigital conductor structure disposed on the 43° rotated Y cut plane of the quartz crystal.

3. An elastic surface wave propagation device comprising a substrate for elastic surface wave propagation, a transmitting transducer disposed on the flat major surface of said substrate for converting an electric signal into an elastic surface wave, and a receiving transducer disposed opposite to said transmitting transducer on the major surface of the substrate for converting the elastic surface wave into an electric signal, in which the substrate is formed of quartz crystal; the major surface of said substrate is a 43° rotated Y cut plane of said quartz crystal; and the angle between the direction of propagation of the elastic surface wave, that is, the direction joining the transmitting and receiving transducers, and the X-axis direction of the quartz crystal is in the range of 8° to 12°.

4. An elastic surface wave propagation device according to claim 3 wherein the transmitting and receiving transducers are each composed of electrodes of interdigital conductor structure disposed on the 43° rotated Y cut plane of the quartz crystal.

* * * * *